United States Patent
Lim et al.

(10) Patent No.: US 9,577,028 B2
(45) Date of Patent: Feb. 21, 2017

(54) SEMICONDUCTOR DEVICE INCLUDING A CAPACITOR

(71) Applicant: Samsung Electronics Co., Ltd., Suwon-si (KR)

(72) Inventors: Dongwon Lim, Suwon-si (KR); Kweonjae Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/153,742

(22) Filed: May 13, 2016

(65) Prior Publication Data

US 2016/0358998 A1    Dec. 8, 2016

(30) Foreign Application Priority Data

Jun. 2, 2015 (KR) .................. 10-2015-0077971

(51) Int. Cl.
*H01L 49/02* (2006.01)
*H01L 27/108* (2006.01)

(52) U.S. Cl.
CPC ......... *H01L 28/75* (2013.01); *H01L 27/10814* (2013.01); *H01L 27/10823* (2013.01); *H01L 27/10855* (2013.01); *H01L 27/10885* (2013.01); *H01L 28/65* (2013.01); *H01L 28/90* (2013.01)

(58) Field of Classification Search
CPC ............... H01L 21/02178; H01L 21/02186
See application file for complete search history.

(56) References Cited

U.S. PATENT DOCUMENTS

| | | | |
|---|---|---|---|
| 6,495,414 B2 | 12/2002 | Han et al. | |
| 6,573,547 B2 | 6/2003 | Ahn et al. | |
| 6,653,198 B2 | 11/2003 | Ahn et al. | |
| 6,673,668 B2 | 1/2004 | Kim et al. | |
| 6,677,254 B2 | 1/2004 | Narwankar et al. | |
| 7,422,943 B2 | 9/2008 | Lee et al. | |
| 8,889,507 B2 | 11/2014 | Wu et al. | |
| 2002/0076936 A1* | 6/2002 | Iguchi ................. | C23F 4/00 438/710 |
| 2003/0022454 A1* | 1/2003 | Wang ................. | H01L 28/75 438/381 |
| 2005/0098816 A1* | 5/2005 | Baniecki ............. | H01G 4/008 257/306 |
| 2009/0273882 A1 | 11/2009 | Park et al. | |
| 2009/0305478 A1* | 12/2009 | Yang ................... | H01L 21/0206 438/393 |
| 2012/0049257 A1 | 3/2012 | Lee et al. | |
| 2012/0064689 A1* | 3/2012 | Hirota ................. | H01L 21/02178 438/381 |
| 2012/0273921 A1 | 11/2012 | Do et al. | |

* cited by examiner

*Primary Examiner* — Thao P Le

(74) *Attorney, Agent, or Firm* — Muir Patent Law, PLLC

(57) ABSTRACT

A capacitor in a semiconductor device may include a lower electrode, a dielectric layer including a metal oxide and disposed on the lower electrode, a first material layer including aluminum oxide ($Al_xO_y$) and disposed on the dielectric layer, a second material layer including titanium oxynitride ($Ti_xO_yN_z$) and disposed on the first material layer, and an upper electrode disposed on the second material layer, wherein the first material layer is between the dielectric layer and the second material layer, and the dielectric layer is between the lower electrode and the first material layer.

20 Claims, 16 Drawing Sheets

SEMICONDUCTOR DEVICE INCLUDING A CAPACITOR

CROSS-REFERENCE TO RELATED APPLICATIONS

This application claims priority under 35 U.S.C. §119(a) to Korean Patent Application No. 10-2015-0077971, filed on Jun. 2, 2015, in the Korean Intellectual Property Office, the disclosure of which is hereby incorporated by reference in its entirety.

BACKGROUND

The present disclosure relates to a method of manufacturing a semiconductor device, and more particularly, to a semiconductor device including a capacitor.

Due to their small-sized, multifunctional and/or low-cost characteristics, semiconductor devices are being spotlighted as important elements in the electronic industry. However, as design rules of the semiconductor devices are continuously decreasing, it is causing many problems. For example, the height and/or aspect ratio of the patterns are significantly increased while decreasing the width and/or spacing of the patterns by the high integration density of the semiconductor devices. Accordingly, the variation of the deposition and/or etching process of a thin film is gradually deteriorated and the reliability of the semiconductor device can be reduced.

SUMMARY

Example embodiments provide a highly integrated capacitor with more improved reliability.

According to example embodiments, a capacitor may include a lower electrode comprising a conductive material, a dielectric layer including a metal oxide and disposed on a lower electrode, a first material layer including aluminum oxide ($Al_xO_y$) and disposed on the dielectric layer, a second material layer including titanium oxynitride ($Ti_xO_yN_z$) and disposed on the first material layer, and an upper electrode disposed on the second material layer, wherein the first material layer is between the dielectric layer and the second material layer, and the dielectric layer is between the lower electrode and the first material layer. The first material layer may be a diffusion blocking layer that prevents diffusion of oxygen atoms from the dielectric layer to the lower electrode. The second material layer may be an oxygen donating layer that donates oxygen atoms to the upper electrode. The dielectric layer may be a different material from the first material layer. The second material layer may be formed of a different material from the dielectric layer and the first material layer. The first material layer may consist of a material that has a larger band gap than the dielectric layer.

In example embodiments, the first material layer may have a thickness in the range of 5 Å to 10 Å.

In example embodiments, the second material layer may have a thickness in the range of 5 Å to 10 Å.

In example embodiments, the capacitor may further include a material layer including at least one of titanium nitride ($Ti_xN_y$) and titanium aluminum oxide ($Ti_xAl_yO_z$) disposed between the first and second material layers.

In example embodiments, the capacitor may further include a material layer including titanium nitride ($Ti_xN_y$) disposed between the second material layer and the upper electrode during the formation of the upper electrode.

In example embodiments, the dielectric layer may include at least one selected from the group consisting of zirconium oxide ($Zr_xO_y$), aluminum oxide ($Al_xO_y$), hafnium oxide ($Hf_xO_y$), zirconium hafnium oxide ($Zr_xHf_yO_z$), hafnium aluminum oxide ($Hf_xAl_yO_z$), zirconium aluminum oxide ($Zr_xAl_yO_z$), zirconium silicate ($Zr_xSi_yO_z$), hafnium silicate ($Hf_xSi_yO_z$) and zirconium hafnium silicate ($Zr_xHf_ySi_zO_q$).

In example embodiments, the lower electrode may include at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (Ta AlN), tungsten nitride (WN), platinum oxide (PtO), ruthenium oxide ($RuO_2$), iridium oxide ($IrO_2$), SRO(Sr$RuO_3$), BSRO((Ba,Sr)$RuO_3$), CRO(Ca$RuO_3$) and LSCo.

In example embodiments, the upper electrode may include at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (Ta AlN), tungsten nitride (WN), platinum oxide (PtO), ruthenium oxide($RuO_2$), iridium oxide ($IrO_2$), SRO(Sr$RuO_3$), BSRO((Ba,Sr)$RuO_3$), CRO(Ca$RuO_3$) and LSCo.

According to example embodiments, the lower electrode has a hollow cylindrical shape with a closed bottom; the dielectric layer is conformally formed on inner and outer surfaces of the lower electrode; the first material layer is conformally formed on the dielectric layer; and the second material layer is conformally formed on the first material layer. The first and second material layers may partially fill an inside of the lower electrode.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A to 11A are plan views illustrating a method of manufacturing a semiconductor device according to example embodiments of the inventive concept, and FIGS. 5B to 11B are exemplary cross-sectional views taken along line I-I' shown in FIGS. 5A to 11A.

Figure 1:
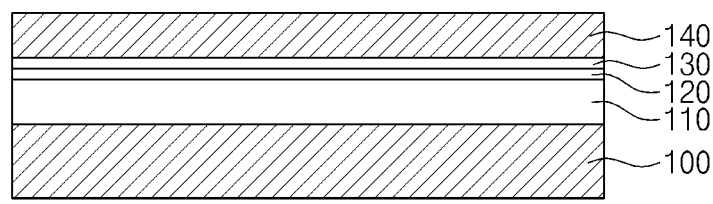
FIG. 1 is a cross-sectional view illustrating a capacitor according to example embodiments of the inventive concept.

It should be noted that these figures are intended to illustrate the general characteristics of methods, structure and/or materials utilized in certain example embodiments and to supplement the written description provided below. The relative thicknesses and positioning of molecules, layers, regions and/or structural elements may be reduced or exaggerated for clarity. The use of similar or identical reference numbers in the various drawings is intended to indicate the presence of a similar or identical element or feature. Though the different figures may show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when considering the figures and their description as a whole.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. Other words used to describe the relationship between elements or layers should be interpreted in a like fashion (e.g., "between" versus "directly between," "adjacent" versus "directly adjacent," "on" versus "directly on"). In contrast, when an element is referred to as being "directly connected," "directly coupled," or "directly adjacent" to another element, or as "contacting" or "in contact with" or "directly on" another element, there are no intervening elements present.

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a capacitor according to example embodiments of the inventive concept.

Referring to FIG. 1, a capacitor may include a lower electrode 100, a dielectric layer 110, a first material layer 120, a second material layer 130 and an upper electrode 140.

The lower electrode 100 may include at least one of doped silicon, metal, metal nitride and metal silicide. For example, the lower electrode 100 may include at least one selected from the group consisting of refractory metal such as cobalt, titanium, nickel, tungsten and molybdenum, or noble metal such as platinum, ruthenium and iridium. In addition, the lower electrode 100 may include metal nitride such as titanium nitride (TiN), titanium silicon nitride (TiSiN), titanium aluminum nitride (TiAlN), tantalum nitride (TaN), tantalum silicon nitride (TaSiN), tantalum aluminum nitride (Ta AlN) and tungsten nitride (WN). Alternatively, the lower electrode 100 may include a conductive noble metal oxide such as platinum oxide (PtO), ruthenium oxide ($RuO_2$) or iridium oxide ($IrO_2$), or conductive oxide such as SRO ($SrRuO_3$), BSRO(($Ba,Sr)RuO_3$), CRO($CaRuO_3$), LSCo.

In example embodiments, the lower electrode 100 may include one of titanium or titanium nitride.

The upper electrode 140 may include at least one of doped silicon, metal, metal nitride and metal silicide. For example, the upper electrode 140 may include at least one selected from the group consisting of refractory metal such as cobalt, titanium, nickel, tungsten and molybdenum, or noble metal such as platinum, ruthenium and iridium. In addition, the upper electrode 140 may include metal nitride such as titanium nitride (TiN), titanium silicon nitride (TiSiN), titanium aluminum nitride (TiAlN), tantalum nitride (TaN), tantalum silicon nitride (TaSiN), tantalum aluminum nitride (Ta AlN) and tungsten nitride (WN). Alternatively, the upper electrode 140 may include a conductive noble metal oxide such as platinum oxide (PtO), ruthenium oxide ($RuO_2$) or iridium oxide ($IrO_2$), or conductive oxide such as SRO ($SrRuO_3$), BSRO(($Ba,Sr)RuO_3$), CRO($CaRuO_3$), LSCo.

In example embodiments, the upper electrode 140 may include one of titanium or titanium nitride.

In some embodiments, the upper electrode 140 is formed of the same material as the lower electrode 100. In other embodiments, the upper electrode 140 is formed of a different material from the lower electrode 100.

The dielectric layer 110 may include a high-k dielectric having a higher dielectric constant than silicon oxide. For example, the dielectric layer 110 may include at least one of zirconium oxide ($Zr_xO_y$), aluminum oxide ($Al_xO_y$), hafnium oxide ($Hf_xO_y$), zirconium hafnium oxide ($Zr_xHf_yO_z$), hafnium aluminum oxide ($Hf_xAl_yO_z$) and zirconium aluminum oxide ($Zr_xAl_yO_z$). Alternatively, the dielectric layer 110 may include at least one of zirconium silicate ($Zr_xSi_yO_z$), hafnium silicate ($Hf_xSi_yO_z$) and zirconium hafnium silicate ($Zr_xHf_ySi_zO_q$). In example embodiments, the dielectric layer 110 is not limited to the material listed above. The dielectric layer 110 may have a single-layer or multi-layer structure. In a multi-layer structure of the dielectric layer 110, in some embodiments, the different layers are formed such that at least two of them have different respective materials.

In example embodiments, the first material layer 120 may be disposed adjacent to (e.g., directly adjacent to) the dielectric layer 110, and may prevent diffusion of oxygen atoms from the dielectric layer 110 into the upper electrode 140. For example, the first material layer 120 may contact the dielectric layer 110. The first material layer 120 may include, for example, aluminum oxide ($Al_xO_y$). The first material layer 120 may have a thickness in the range of about 5 Angstroms to about 10 Angstroms. For example, the first material layer 120 may have a thickness of 5 Angstroms, or may have a thickness of 10 Angstroms, or may have any thickness therebetween. In some embodiments, the thickness of the first material layer 120 is the same throughout.

The aluminum oxide ($Al_xO_y$) may have a strong oxygen affinity. A band gap of the aluminum oxide having about 8.8 eV may be greater than that of titanium oxide (about 3 eV) or zirconium oxide (about 5 eV to about 7 eV), which may form the dielectric layer 110. Thus, the material that forms the first material layer 120 may have a greater band gap than the material that forms the dielectric layer 110. The first material layer 120 may prevent the diffusion of oxygen atoms from the dielectric layer 110 into the upper electrode 140. In a case where oxygen atoms contained in the dielectric layer 110 move into the upper electrode 140, dipoles may occur from oxygen vacancies in the dielectric layer 110, thereby reducing the work function of the dielectric layer 110.

Accordingly, electrical reliability of the capacitor may be improved by preventing loss of oxygen atoms in the dielectric layer 110 using the first material layer 120 between the dielectric layer 110 and the upper electrode 140. The first material layer 120 may be referred to as a diffusion-blocking layer, or an oxygen-holding layer.

In example embodiments, the second material layer 130 may be disposed between the first material layer 120 and the upper electrode 140, thereby stabilizing interface characteristics between the first material layer 120 and the upper electrode 140. The second material layer 130 may include, for example, titanium oxynitride ($Ti_xO_yN_z$). The second material layer 130 may have a thickness in the range of about 5 Angstroms to 10 Angstroms. For example, the second material layer 130 may have a thickness of 5 Angstroms, or may have a thickness of 10 Angstroms, or may have any thickness therebetween. In some embodiments, the thickness of the second material layer 130 is the same throughout.

The titanium oxynitride ($Ti_xO_yN_z$) may function as a donating layer providing oxygen atoms to the upper electrode 140 during the manufacturing process, and a portion of the titanium oxynitride ($Ti_xO_yN_z$) may be converted to titanium nitride (TiN) by the reduction thereof. Accordingly, interface characteristics between the upper electrode layer 140 and the second material layer 130 may be stably maintained. Therefore, by using a combination of a first material layer including aluminum oxide ($Al_xO_y$) adjacent to the lower electrode, and a second material layer including titanium oxynitride ($Ti_xO_yN_z$) adjacent to the upper electrode, electrical characteristics for the capacitor can be maintained.

Figure 2:
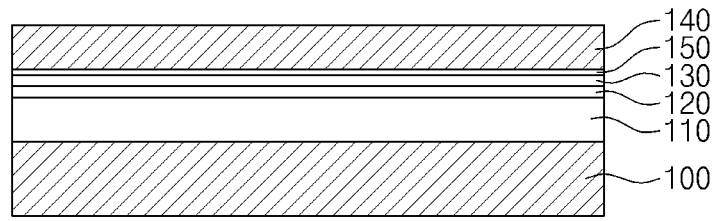
FIGS. 2 and 3 are cross-sectional views illustrating a capacitor according to example embodiments of inventive concept.
Figure 3:
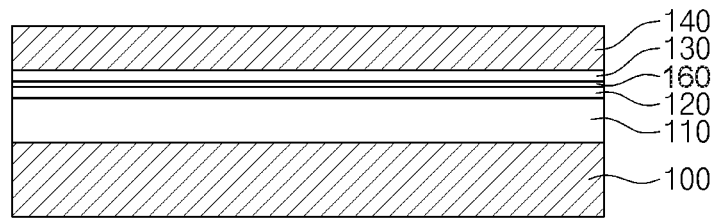

FIGS. 2 and 3 are cross-sectional views illustrating a capacitor according to example embodiments of the inventive concept.

Referring to FIGS. 2 and 3, the capacitor may include a lower electrode 100, a dielectric layer 110, a first material layer 120, a second material layer 130 and an upper electrode 140.

According to example embodiment shown in FIG. 2, the capacitor may provide a third material layer 150 between the second material layer 130 and the upper electrode 140. The third material layer 130 may be a mixed layer of the second material layer 130 and the upper electrode 140. For example, the third material layer 150 may include at least one of titanium nitride ($Ti_xN_y$) and titanium oxynitride ($Ti_xO_yN_z$). More specifically, in one example, where the upper electrode 140 is formed of titanium nitride (TiN), and the second material layer 130 is formed of titanium oxynitride ($Ti_xO_yN_z$), the third material layer 150 may be formed of a combination of titanium nitride (TiN) and titanium oxynitride ($Ti_xO_yN_z$).

According to the example embodiment shown in FIG. 3, a capacitor may provide a fourth material layer 160 between first and second material layers 120 and 130. The fourth material layer 160 may be a mixed layer of the first and second material layers 120 and 130. For example, the fourth material layer 160 may include at least one of titanium nitride ($Ti_xN_y$) and titanium aluminum oxide ($Ti_xAl_yO_z$). It should be noted that the terms "first," "second," "third," "fourth," etc., used to describe these layers are merely used as naming conventions, and thus different layers could be given different labels depending on what is being described. Thus, layers described outside of the context of particular drawings (e.g., such as in the claims) should be interpreted based on relational language used in such description, regardless of what labels are used to described each layer.

Although not shown in detail in the drawings, in one embodiment, the third material layer 150 may be disposed between the second material layer 130 and the upper electrode 140, and the fourth material layer 160 layer maybe disposed between the first and second material layers 120 and 130. As such, in some embodiments, an interface between the second material layer 130 and the upper electrode 140 may include a mixture of the materials from each of those layers. In some embodiments, an interface between the first material layer 120 and second material layer 130 may include a mixture of the materials from each of those layers. For these mixtures of materials, at a given horizontal plane, both materials may be present at more than incidental levels (e.g., presence may be between 20% and 80% of the overall material at a given horizontal plane).

Figure 4:
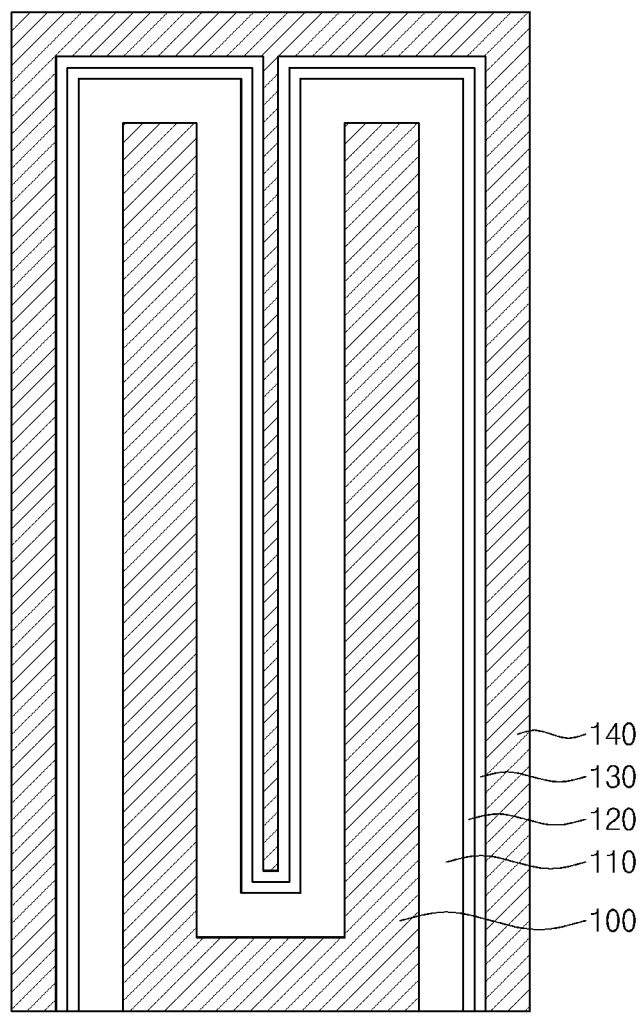
FIG. 4 is a cross-sectional view illustrating a capacitor according example embodiments of inventive concept.

FIG. 4 is a cross-sectional view illustrating a capacitor according example embodiments.

Referring to FIG. 4, the capacitor may include a lower electrode 100, a dielectric layer 110, a first material layer 120, a second material layer 130 and an upper electrode 140.

The lower electrode 100 may be a structure having a hollow cylindrical shape with a closed bottom.

The dielectric layer 110 may be conformally provided on inner and outer surfaces of the lower electrode 100 not to completely fill an inside of the lower electrode 100.

The first material layer 120 may be conformally provided on the dielectric layer 110 not to completely fill the inside of the lower electrode 100.

The second material layer 130 may be conformally provided on the first material layer 120 not to completely fill the inside of the lower electrode 100.

The upper electrode 140 may be provided on the second material layer 130 to completely fill the remaining portions of the inside of the lower electrode 100.

According to modified embodiments of the inventive concept, the capacitor may further include a third material layer 150 provided between the first and second material layer 120 and 130 and/or a fourth material layer 160 between the second material layer 130 and the upper electrode 140.

The capacitor shown in FIG. 4 has a different structure from the capacitors shown in FIGS. 1 to 3, but the function and material of each of the elements may be substantially the same. Accordingly, repeated descriptions are omitted.

FIGS. 5A to 11A are plan views illustrating a method of manufacturing a semiconductor device according to example embodiments, and FIGS. 5B to 11B are cross-sectional views taken along line I-I' shown in FIGS. 5A to 11A. In example embodiments, the semiconductor device is DRAM (Dynamic Random Access Memory) to be described by way of example, but the semiconductor device is not limited thereto.

Figure 5A:
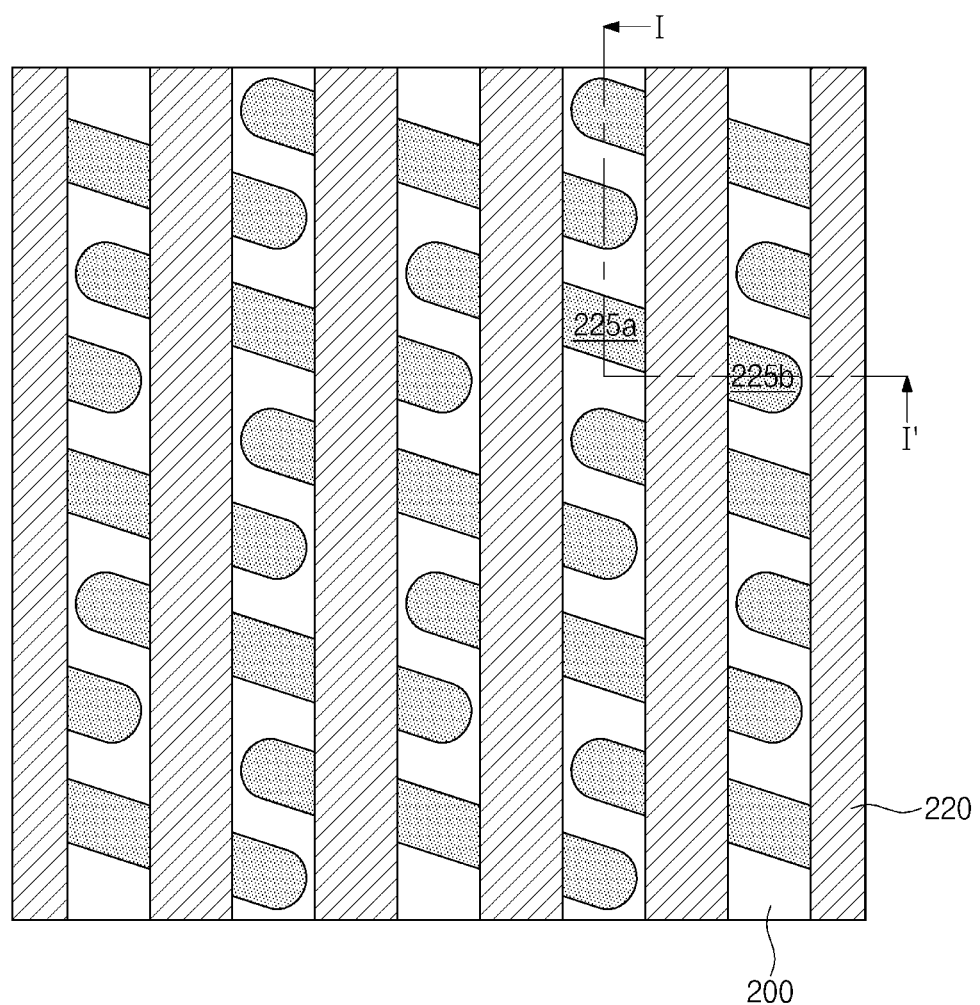
Figure 5B:
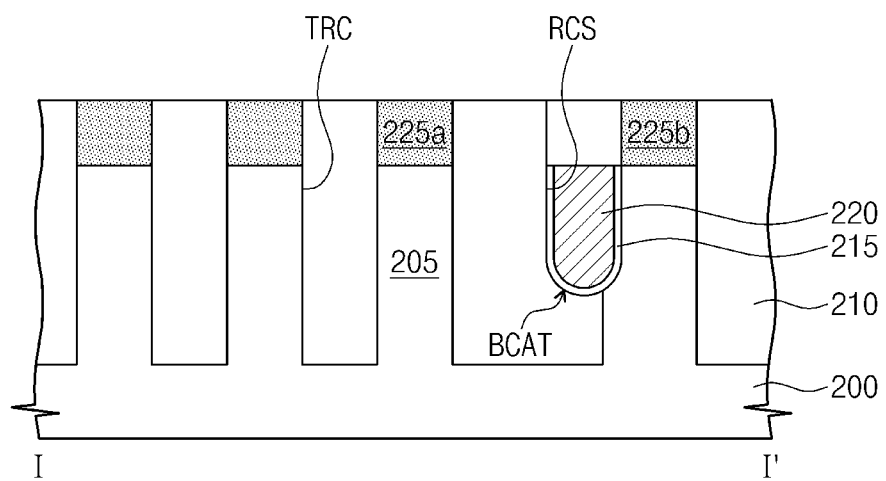

Referring to FIGS. 5A and 5B, transistors BCAT including gate electrodes 220 extending one direction may be formed in a substrate 200.

The substrate 200 may include a semiconductor substrate such as silicon, germanium and silicon/germanium, a SOI (Silicon On Isolator) substrate or a GOI (Germanium On Isolator) substrate. An active region(s) 205 may be defined by forming a device isolation pattern 210. The device isolation pattern 210 may be formed by filling a trench TRC with an insulation material. The trench TRC may be formed, for example, by etching the substrate 200. The insulation material may include at least one of silicon oxide, silicon nitride and silicon oxynitride.

Recesses RCS may be formed to cross the device isolation pattern 210 and the active regions 205 in one direction in the substrate 200. A gate insulation layer 215 may be conformally formed on an inner surface of each of the recesses RCS formed in the substrate 200. A gate electrode 220 may be formed by filling a portion of the recess RCS with conductive material, rather than completely filling the recess RCS. For example, the gate electrode 220 may be recessed with respect to a top surface of the device isolation layer 210. The gate insulation layer 215 may include, for example, silicon oxide, and the conductive material may include, for example, silicon doped with impurity. Each of the gate electrodes may be covered by a capping layer.

First and second impurity regions 225a and 225b may be formed at opposite sides of the gate electrode 220, for example, by implanting impurity ions in the exposed portion of the active region 205. The transistor may be a buried channel array transistor having a buried channel structure in the substrate 200.

In other embodiments of the inventive concept, a gate insulation layer 215 and a conductive layer (not shown) may be sequentially formed on the substrate 200 including the device isolation pattern 210 and the active regions 205 formed therein, and then gate electrodes 220 extending in one direction may be formed by patterning the conductive layer. First and second impurity regions 225a and 225b may be formed at opposite sides of the gate electrodes 220 by implanting impurity ions in the exposed portion of the active region 205.

In still other embodiments of the inventive concept, fin-shaped active regions 205 may be formed by etching the substrate 200, and then a device isolation pattern 210 may be formed to cover lower portions of the fin-shaped active regions 205. Accordingly, the fin-shaped active regions may protrude from a surface of the device isolation pattern 210 or the substrate 200. After forming a gate insulation layer 215 and a conductive layer, gate electrodes 220 may be formed by patterning the conductive layer. After etching the active regions exposed by the gate electrodes 220, first and second impurity regions 225a and 225b may be formed by growing an epitaxial layer in the exposed active regions, thereby forming transistors.

FIGS. 5A and 5B show a buried channel array transistor having a buried channel in the substrate 200 as illustrative example, which is, however, provided only for illustration, but transistors according to example embodiments of inventive concept is not limited thereto. In other embodiments, an active region may be formed by growing a fin on a substrate, e.g., using epitaxial growth. However, further details of such a method are not described herein.

Figure 6A:
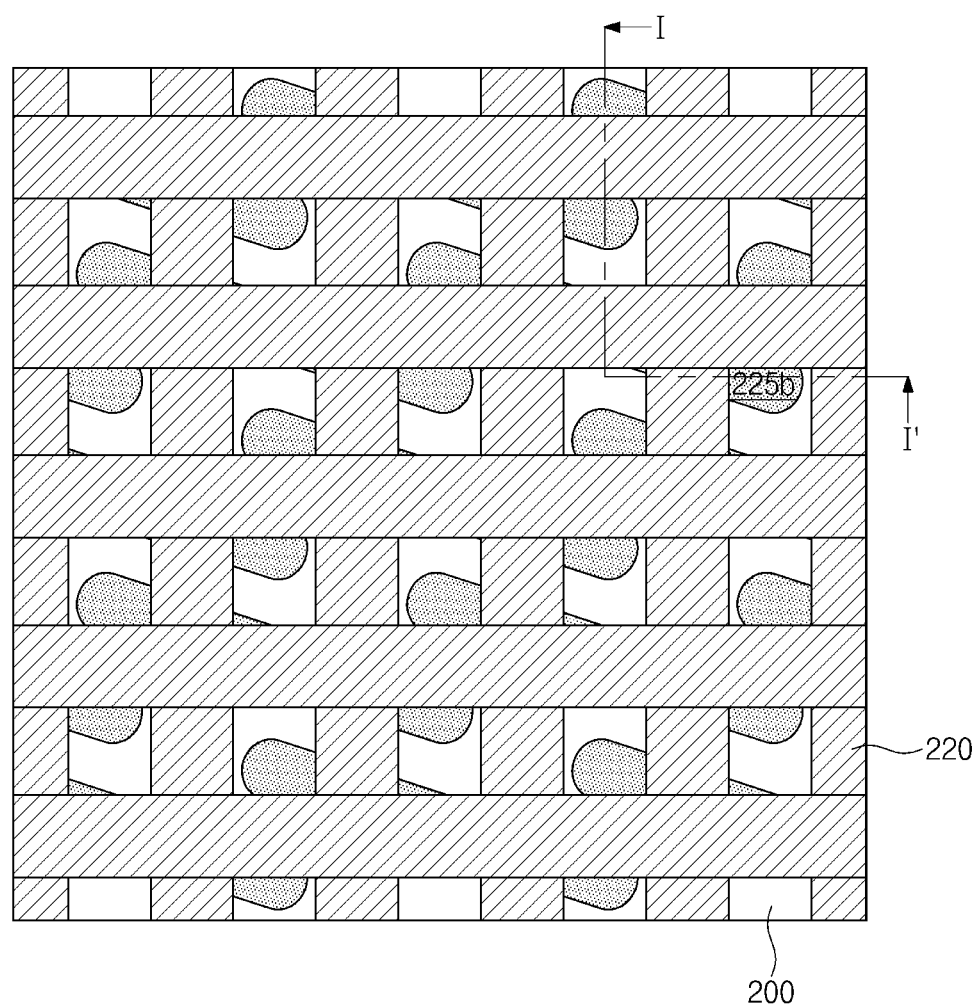
Figure 6B:
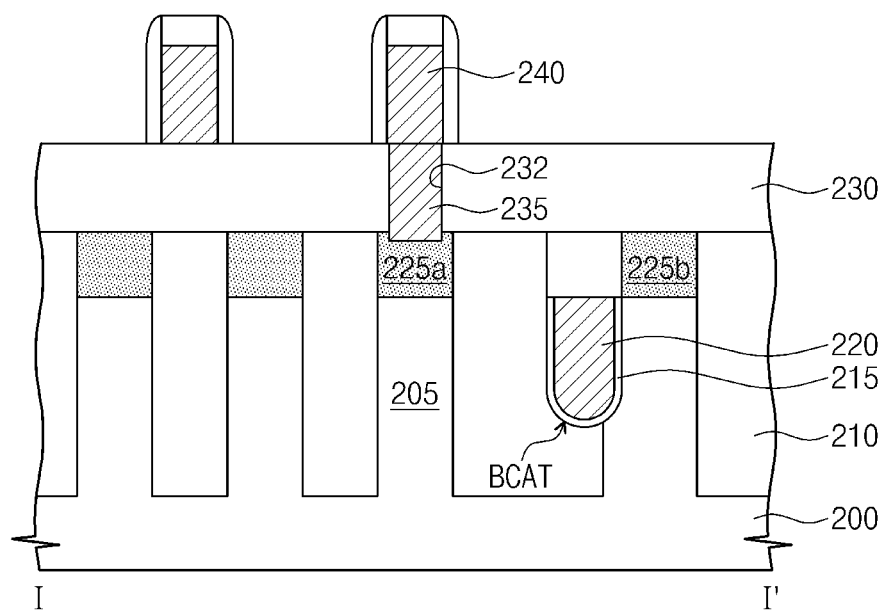

Referring to FIGS. 6A and 6B, bit lines 240 may be formed on the substrate 200 to cross the gate electrodes 220 and to extend in one direction.

In more detail, a first interlayer insulation layer 230 may be formed on the substrate to cover the transistors BACT. Next, first contact holes 232 exposing the first impurity regions 225a may be formed by etching the first interlayer insulation layer 230. The first interlayer insulation layer 230 may include, for example, silicon oxide, silicon nitride or silicon oxynitride. First contact plugs 235 may be formed by filling the first contact holes 232 with a conductive material. The conductive material may include, for example, metal silicide. A conductive layer (not shown) may be formed on the first interlayer insulation layer with the contact plugs 235 therein. Next, bit lines 240 may be formed by patterning the conductive layer. The conductive layer may include metal such as tungsten.

In addition, a capping layer may cover a top surface of each of the bit lines 240, and spacers may cover sidewalls of each of the bit lines 240.

Figure 7A:
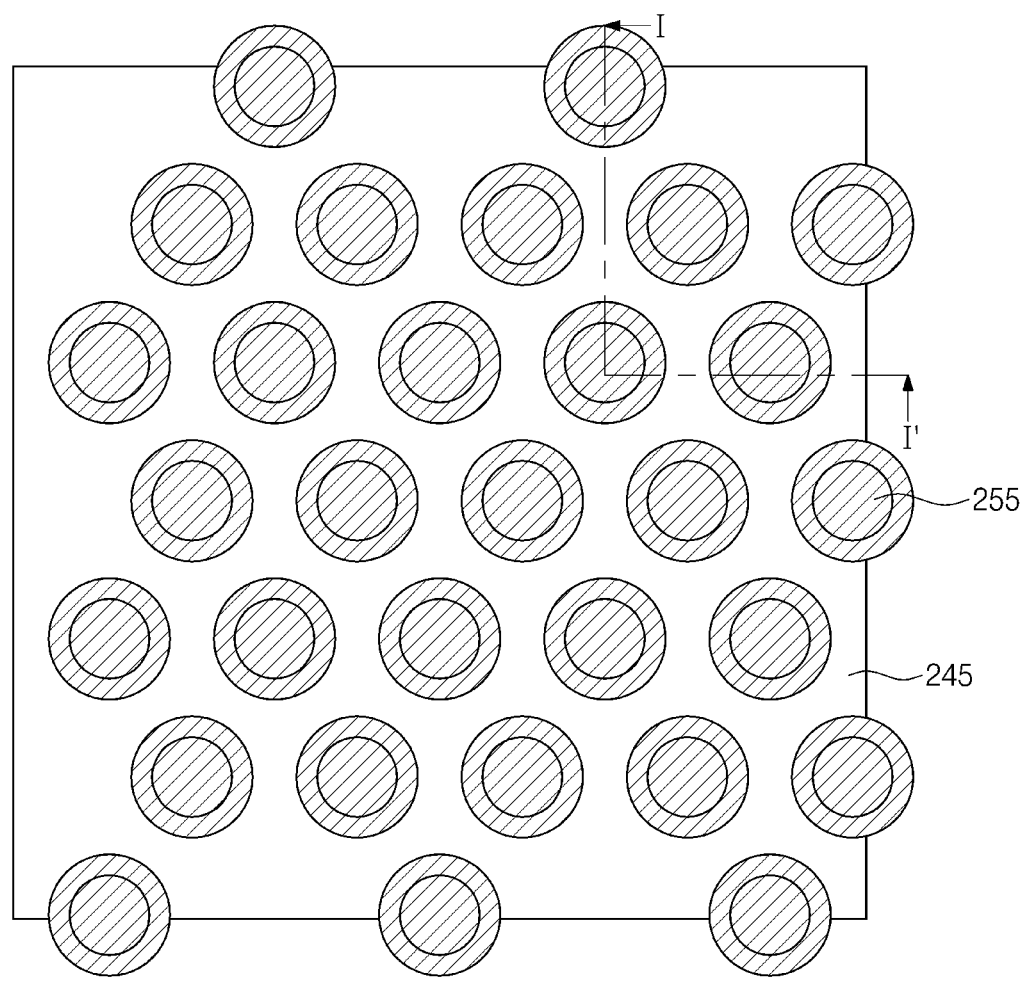
Figure 7B:
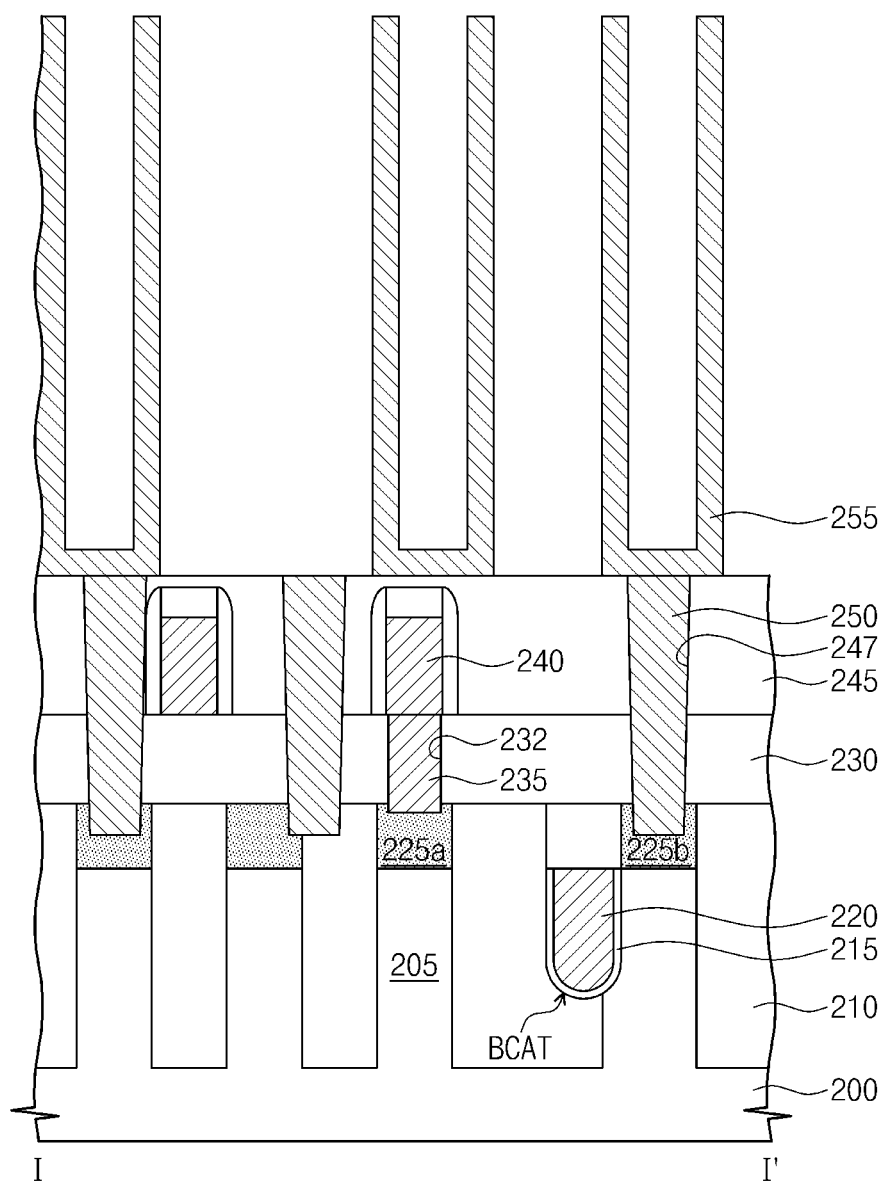

Referring to FIGS. 7A and 7B, lower electrodes 255 may be formed on the substrate to electrically connect with the transistors BCAT, respectively.

According to example embodiments of the inventive concept, a second interlayer insulation layer 245 may be formed on the first interlayer insulation layer 230 to cover the bit lines 240. Next, second contact holes 247 exposing the second impurity regions 225b may be formed by etching the first and second interlayer insulation layer 230 and 245.

The second interlayer insulation layer 245 may include, for example at least one of silicon oxide, silicon nitride, and silicon oxynitride.

The second contact plugs 250 may be formed by filling the second contact holes 247 with a conductive material. A first sacrificial layer (not shown) may be formed on the second contact plugs 250 and the second interlayer insulation layer 245. The first sacrificial layer may include, for example, at least one of silicon oxide, silicon nitride, and silicon oxynitride.

Third contact holes (not shown) exposing the second contact plugs 250 may be formed by etching the first sacrificial layer. A lower electrode layer may be conformally formed on the first sacrificial layer and inner surfaces of the third contact holes. The lower electrode layer may include, for example, titanium or titanium nitride.

A second sacrificial layer (not shown) may be formed on the lower electrode layer. In addition, the third contact holes formed the lower electrode layer may be filled with the second sacrificial layer (not shown). The second sacrificial layer may include, for example, at least one of silicon oxide, silicon nitride and silicon oxynitride. The second sacrificial layer and the lower electrode layer may be planarized to expose an upper surface of the first sacrificial layer, thereby forming lower electrodes 255. Each of the lower electrodes 255 may have a hollow cylindrical shape with a closed bottom.

After forming the lower electrodes 255, the first and second sacrificial layers may be completely removed to expose inner and outer sidewalls of each of the lower electrodes 255.

Although not shown in the drawings, as an aspect ratio of the lower electrode increases, supporters may be further formed to prevent the collapse of the lower electrodes in formation of a hollow cylindrical type capacitor.

Figure 8A:
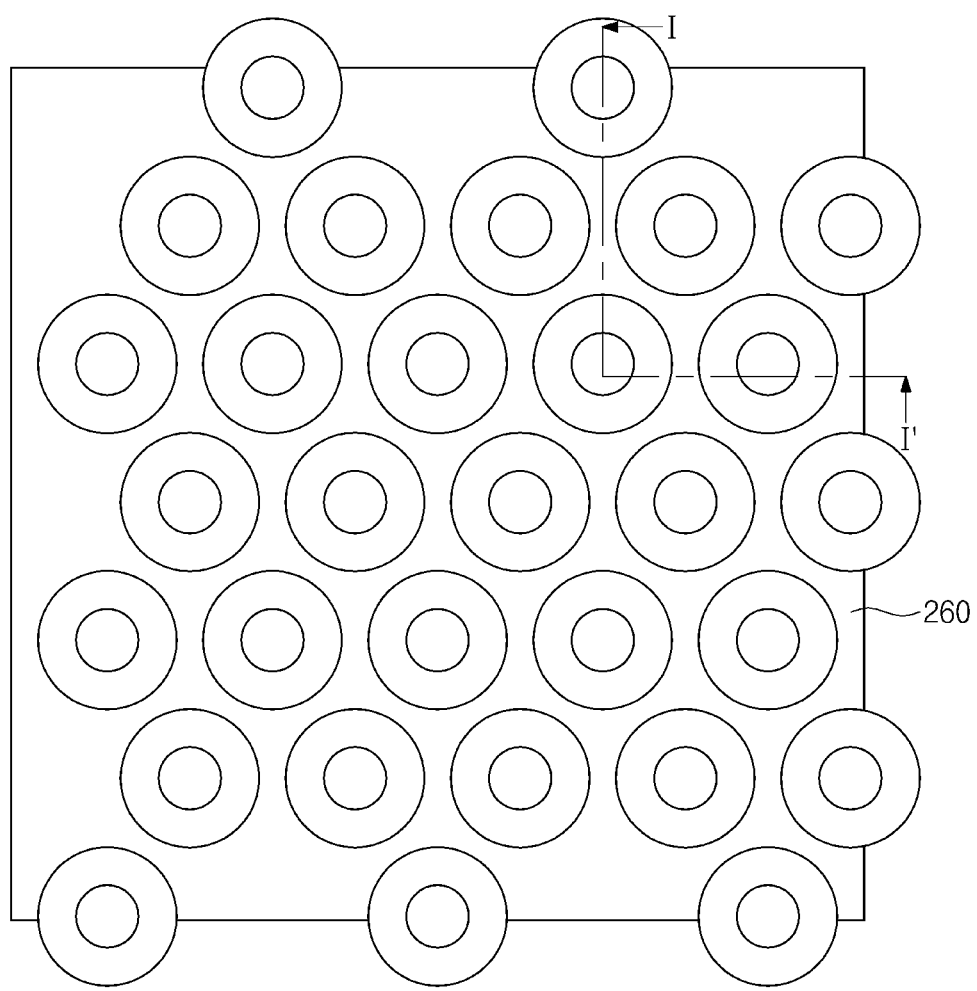
Figure 8B:
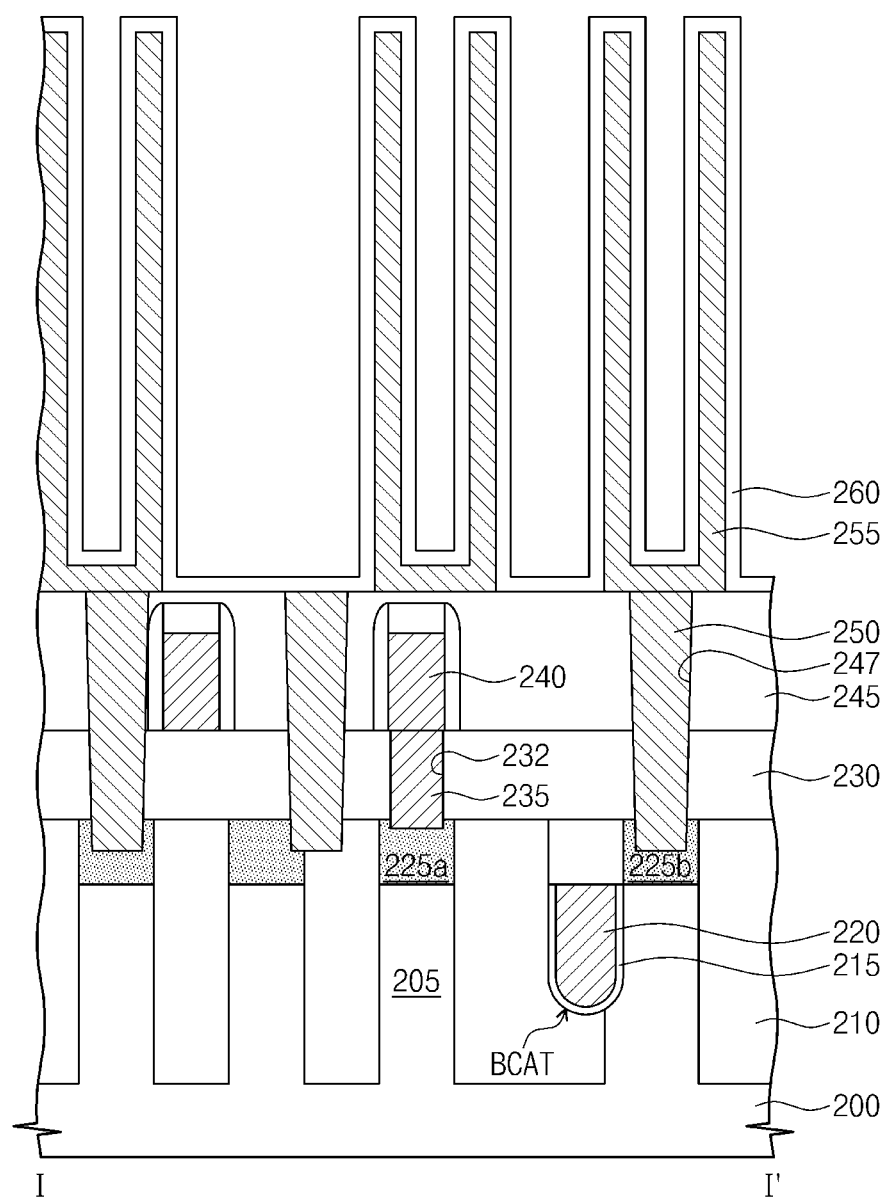

Referring to FIGS. 8A and 8B, a dielectric layer 260 may be conformally and continuously formed along the inner and outer sidewalls of the lower electrodes 255, and also along a bottom inner surface of the lower electrodes 255 and on a portion of the planarized surface including the second interlayer insulating layer 245. The dielectric layer 260 may be formed to partially fill an inside of each of the lower electrodes 235.

For example, the dielectric layer 260 may include a metal oxide such as zirconium oxide ($Zr_xO_y$), aluminum oxide ($Al_xO_y$), hafnium oxide ($Hf_xO_y$).

Figure 9A:
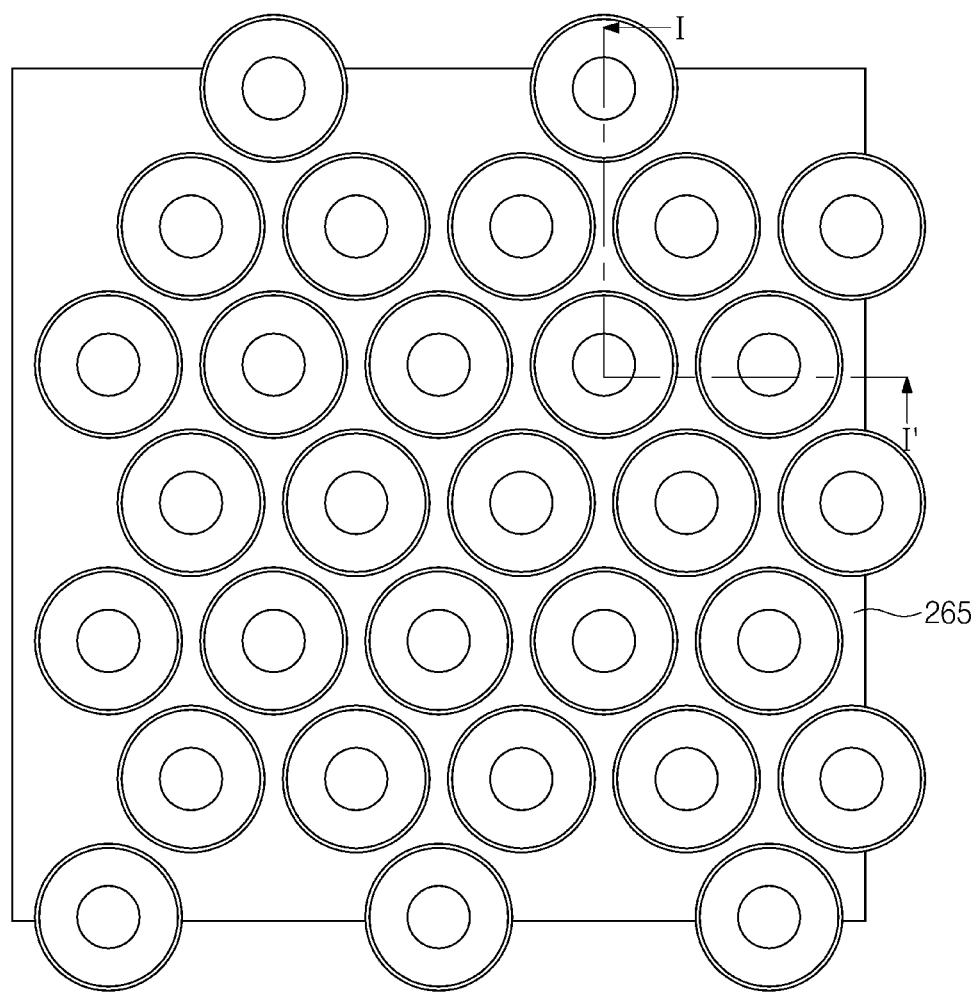
Figure 9B:
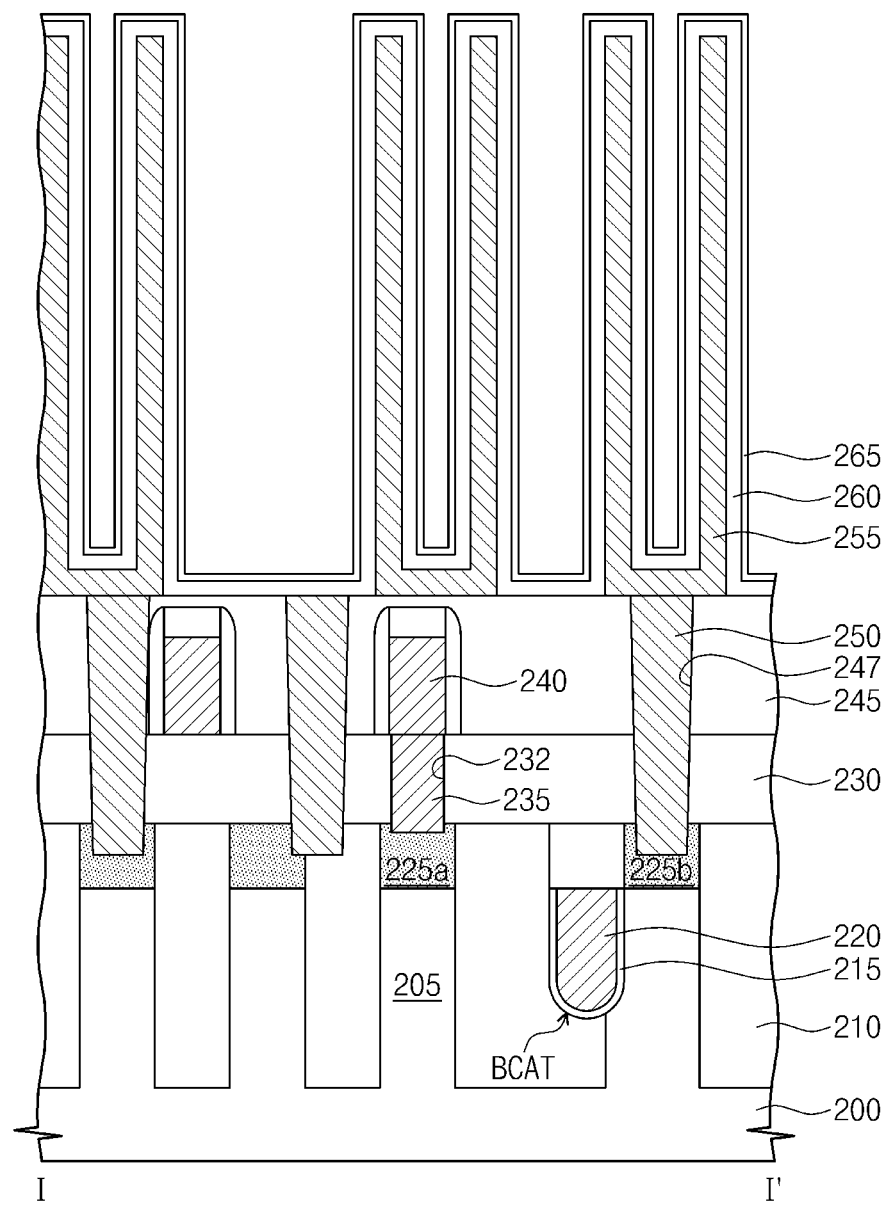

Referring to FIGS. 9A and 9B, a first material layer 265 may be conformally formed on the dielectric layer 260 along the inner and outer sidewalls of the lower electrodes 255, and also along a bottom inner surface of the lower electrodes 255 and on a portion of the planarized surface including the second interlayer insulating layer 245. The first material layer 265 may be formed to partially fill the inside of each of the lower electrodes 255.

The first material layer 265 may prevent diffusion of oxygen atoms from the dielectric layer 260, and thus may be referred to as a diffusion-prevention, or diffusion-blocking layer. The first material layer 265 may have an oxygen affinity, and may thus hold, or trap, oxygen atoms. As such, first material layer 265 may also be referred to as an oxygen-holding layer. According to example embodiments of the inventive concept, the first material layer 265 may include aluminum oxide ($Al_xO_y$), and may have a thickness in the range of about 5 angstroms to about 10 angstroms. The first material layer 265 may consist of a different material from that of the dielectric layer 260. For example, the first material layer 265 may consist of a material that has a greater band gap than the material that forms the dielectric layer 260. In certain embodiments, the first material layer 265 combined with the dielectric material layer 255 can be considered to be a single dielectric material layer, including two sub-layers (e.g., a first sub-layer and second sub-layer).

Figure 10A:
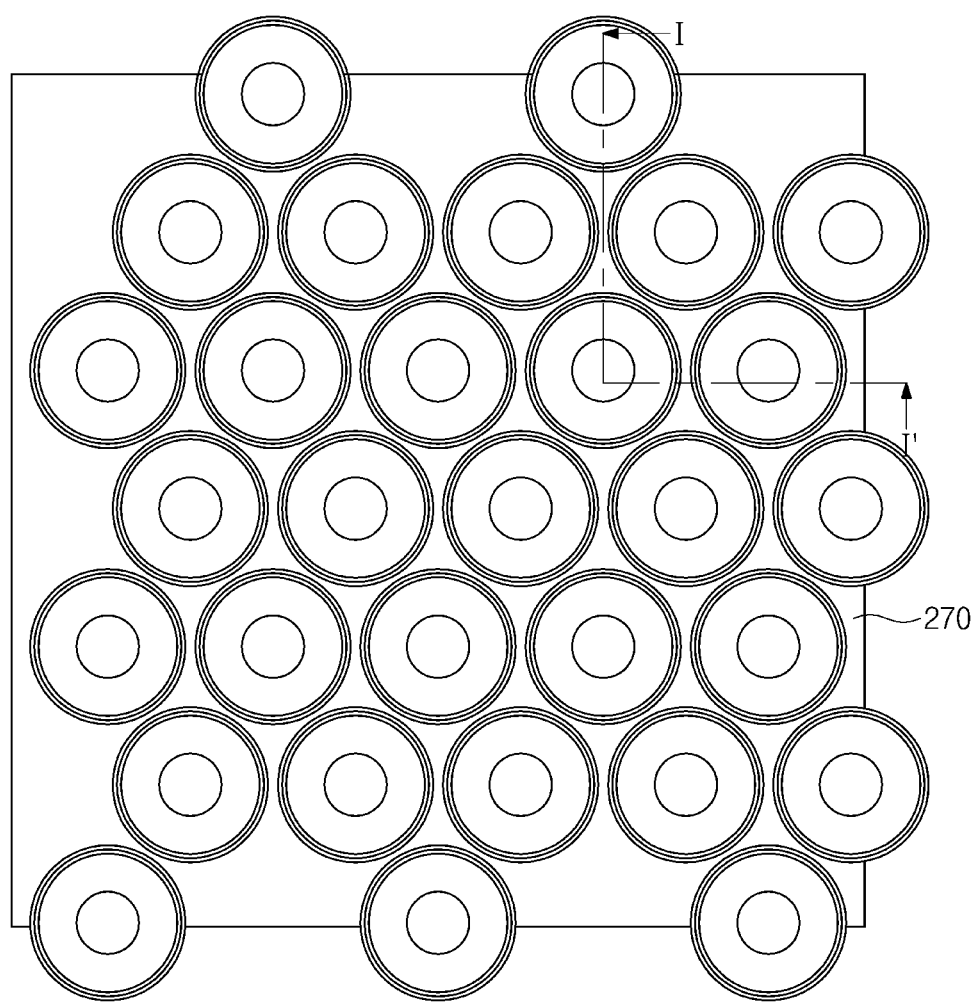
Figure 10B:
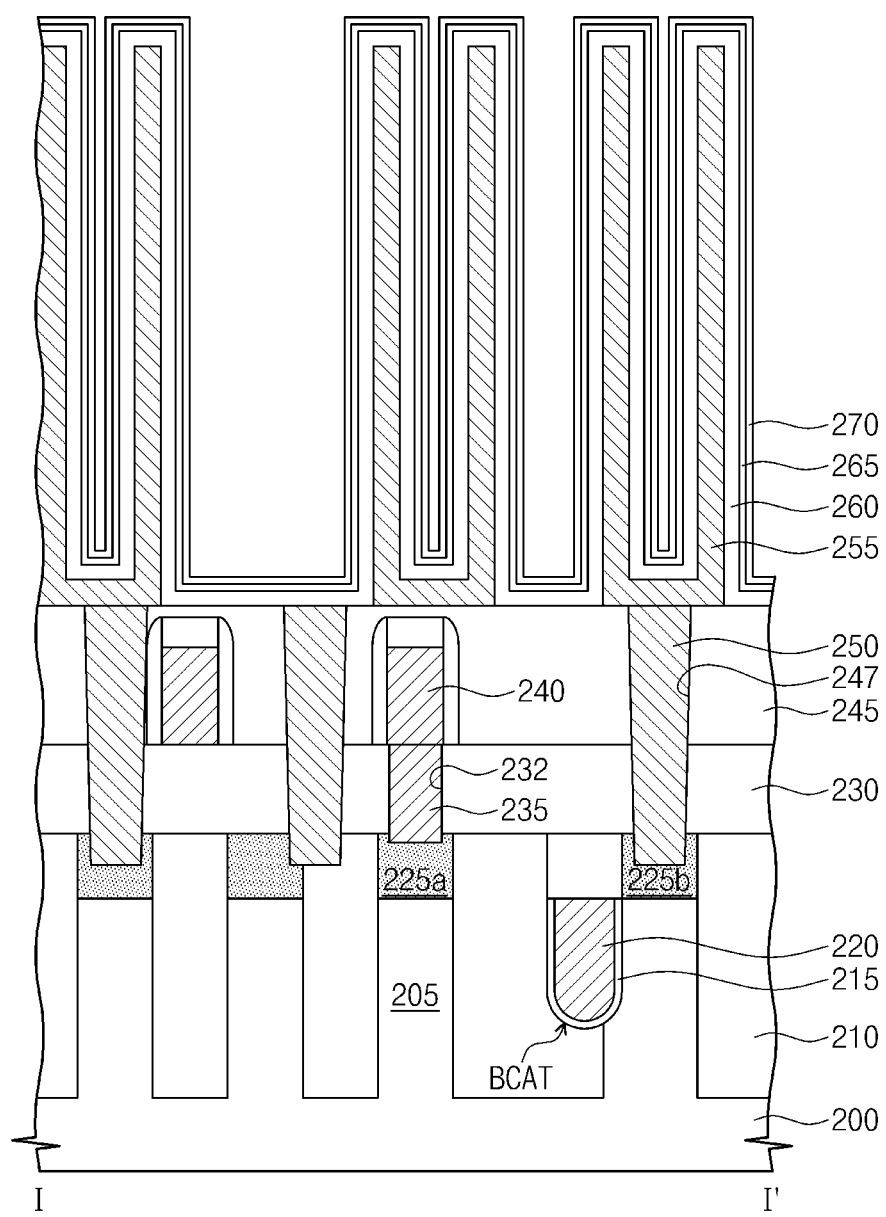

Referring to FIGS. 10A and 10B, a second material layer 270 may be conformally formed on the first material layer 265 along the inner and outer sidewalls of the lower electrodes 255 and also along a bottom inner surface of the lower electrodes 535 and on a portion of the planarized surface including the second interlayer insulating layer 245. The second material layer 270 may be formed to partially fill the inside of each of the lower electrodes 255.

The second material layer 270 may include, for example, titanium oxynitride ($Ti_xO_yN_z$), and may have a thickness in the range of about 5 angstroms to about 10 angstroms. During the subsequent manufacturing process, a portion of the second material layer 270 may be converted to titanium nitride, being substantially the same material as that of an upper electrode 275 (refer to FIG. 11), by reduction thereof. Accordingly, interface characteristics between the second material layer 270 and the upper electrode layer 275 may be stably maintained.

Figure 11A:
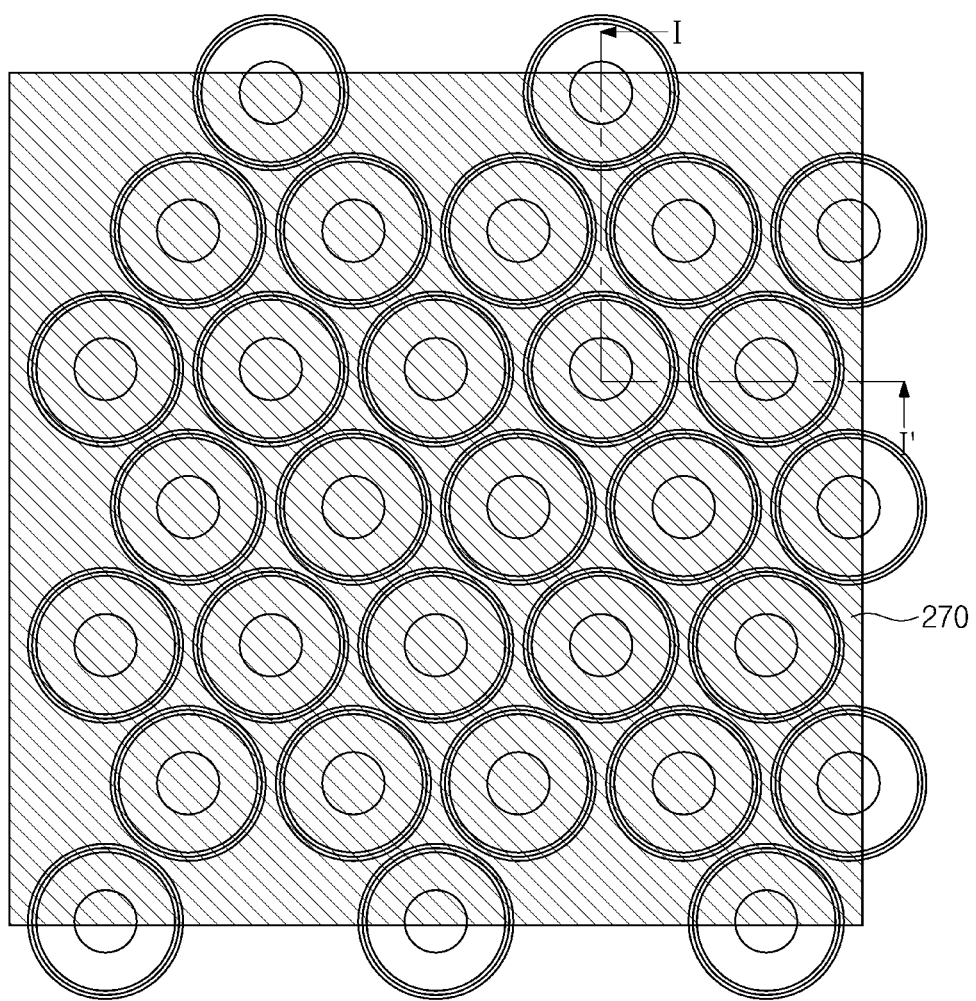
Figure 11B:
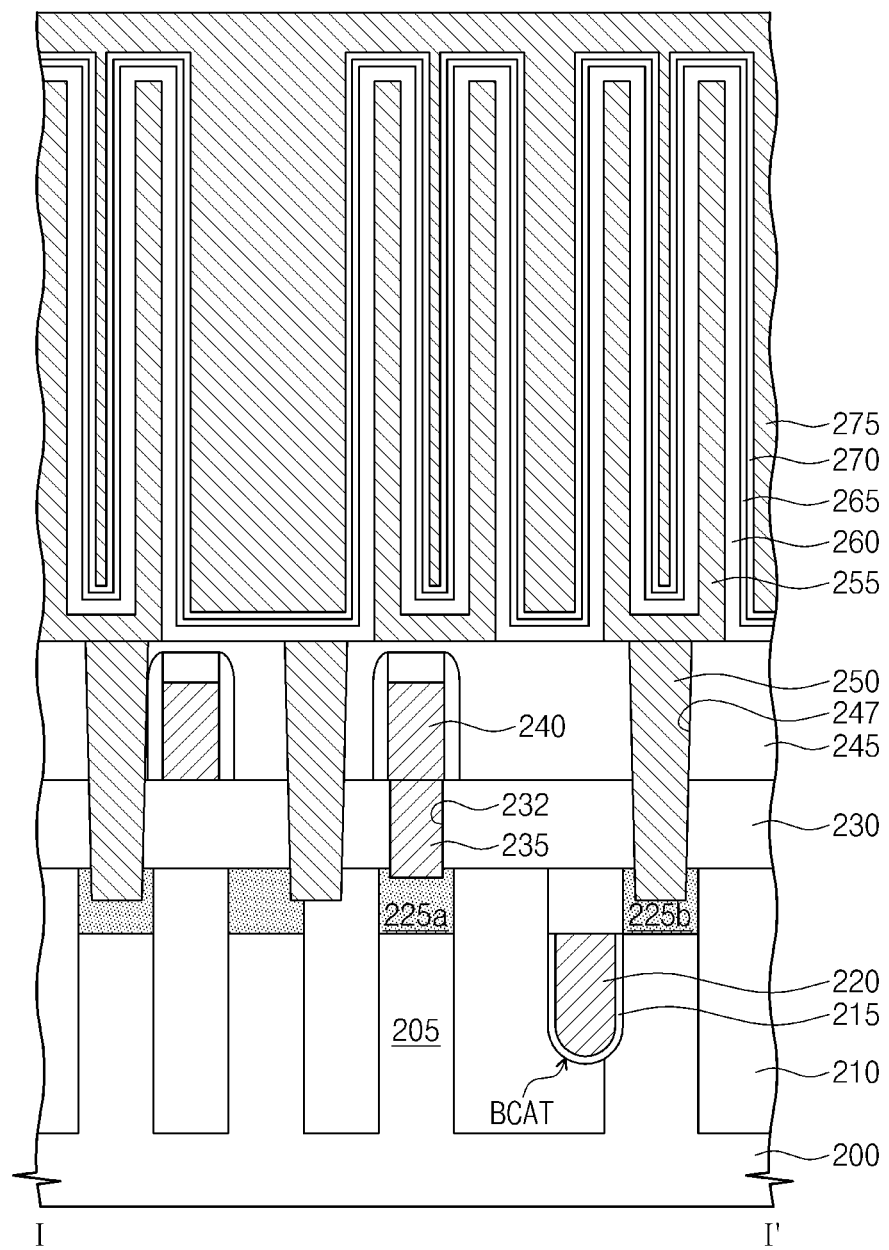

Referring to FIGS. 11A and 11B, an upper electrode 275 may be formed on the second material layer 270 to completely cover the lower electrodes 255. The upper electrode 275 may include, for example, titanium or titanium nitride.

During the manufacturing process according to FIGS. 8A to 11A and 8B to 11B, the first material layer 265 may prevent diffusion of oxygen atoms from the dielectric layer 260 to the upper electrode 275, and the second material layer 270 may stably maintain the interface characteristics between the upper electrode 275 and the second material layer 270. As such, a semiconductor device, for example, a semiconductor chip including capacitors, such as a DRAM, may be formed to have better electrical characteristics. Other semiconductor devices including capacitors may be formed as well.

Although the present disclosure has been described in connection with the embodiments of the present inventive concept illustrated in the accompanying drawings, it is not limited thereto. It will be apparent to those skilled in the art that various substitutions, modification and changes may be made thereto without departing from the scope and spirit of the inventive concepts.

What is claimed is:

1. A semiconductor device including a capacitor, the capacitor comprising:
   a lower electrode comprising a conductive material;
   a dielectric layer including a metal oxide, the dielectric layer disposed on the lower electrode;
   a first material layer including aluminum oxide ($Al_xO_y$), the first material layer disposed on the dielectric layer;
   a second material layer including titanium oxynitride ($Ti_xO_yN_z$), the second material layer disposed on the first material layer; and
   an upper electrode disposed on the second material layer,
   wherein the first material layer is between the dielectric layer and the second material layer, and the dielectric layer is between the lower electrode and the first material layer.

2. The semiconductor device of claim 1, wherein:
   the first material layer has a thickness in the range of 5 Å to 10 Å.

3. The semiconductor device of claim 1, wherein:
   the second material layer has a thickness in the range of 5 Å to 10 Å.

4. The semiconductor device of claim 1, further comprising:
   a third material layer including at least one of titanium nitride ($Ti_xN_y$) and titanium aluminum oxide ($Ti_xAl_yO_z$) disposed between the first and second material layers.

5. The semiconductor device of claim 1, further comprising:
   a third material layer including titanium nitride ($Ti_xN_y$) disposed between the second material layer and the upper electrode.

6. The semiconductor device of claim 1, wherein:
   the dielectric layer includes at least one selected from the group consisting of zirconium oxide ($Zr_xO_y$), aluminum oxide ($Al_xO_y$), hafnium oxide ($Hf_xO_y$), zirconium hafnium oxide ($Zr_xHf_yO_z$), hafnium aluminum oxide ($Hf_xAl_yO_z$), zirconium aluminum oxide ($Zr_xAl_yO_z$), zirconium silicate ($Zr_xSi_yO_z$), hafnium silicate ($Hf_xSi_yO_z$) and zirconium hafnium silicate ($Zr_xHf_ySi_zO_q$).

7. The capacitor of claim 1, wherein:
   the lower electrode includes at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), platinum oxide (PtO), ruthenium oxide ($RuO_2$), iridium oxide ($IrO_2$), SRO ($SrRuO_3$), BSRO($(Ba,Sr)RuO_3$), CRO($CaRuO_3$) and LSCo.

8. The capacitor of claim 1, wherein:
   the upper electrode includes at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), platinum oxide (PtO), ruthenium oxide ($RuO_2$), iridium oxide ($IrO_2$), SRO ($SrRuO_3$), BSRO($(Ba,Sr)RuO_3$), CRO($CaRuO_3$) and LSCo.

9. The semiconductor device of claim 1, wherein:
   the first material layer is a diffusion blocking layer that prevents diffusion of oxygen atoms from the dielectric layer to the lower electrode; and
   the second material layer is an oxygen donating layer that donates oxygen atoms to the upper electrode.

10. The semiconductor device of claim 1, wherein:
    the lower electrode has a hollow cylindrical shape with a closed bottom;
    the dielectric layer is conformally formed on inner and outer surfaces of the lower electrode;
    the first material layer is conformally formed on the dielectric layer; and
    the second material layer is conformally formed on the first material layer,
    wherein the first and second material layers partially fill an inside of the lower electrode.

11. The semiconductor device of claim 10, wherein:
    the first material layer has a thickness in the range of 5 Å to 10 Å.

12. The semiconductor device of claim 10, wherein:
the second material layer has a thickness in the range of 5 Å to 10 Å.

13. The semiconductor device of claim 10, wherein:
the dielectric layer includes at least one selected from the group consisting of zirconium oxide ($Zr_xO_y$), aluminum oxide ($Al_xO_y$), hafnium oxide ($Hf_xO_y$), zirconium hafnium oxide ($Zr_xHf_yO_z$), hafnium aluminum oxide ($Hf_xAl_yO_z$), zirconium aluminum oxide ($Zr_xAl_yO_z$), zirconium silicate ($Zr_xSi_yO_z$), hafnium silicate ($Hf_xSi_yO_z$) and zirconium hafnium silicate ($Zr_xHf_ySi_zO_q$);
the lower electrode includes at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), platinum oxide (PtO), ruthenium oxide ($RuO_2$), iridium oxide ($IrO_2$), SRO ($SrRuO_3$), BSRO(($Ba,Sr$)$RuO_3$), CRO($CaRuO_3$) and LSCo; and
the upper electrode includes at least one selected from the group consisting of cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), platinum oxide (PtO), ruthenium oxide ($RuO_2$), iridium oxide ($IrO_2$), SRO ($SrRuO_3$), BSRO(($Ba,Sr$)$RuO_3$), CRO($CaRuO_3$) and LSCo.

14. The semiconductor device of claim 1, wherein:
the dielectric layer is a different material from the first material layer.

15. A semiconductor device including a capacitor, the capacitor comprising:
a lower electrode comprising a conductive material;
a dielectric layer including a metal oxide, the dielectric layer disposed on the lower electrode;
a first material layer formed of a different material from the dielectric layer, the first material layer disposed on the dielectric layer and being a diffusion-blocking layer;
a second material layer formed of a different material from the dielectric layer and the first material layer, the second material layer disposed on the first material layer and being an oxygen-donating layer; and
an upper electrode disposed on the second material layer, wherein the first material layer is between the dielectric layer and the second material layer, and the dielectric layer is between the lower electrode and the first material layer.

16. The semiconductor device of claim 15, wherein:
the first material layer includes aluminum oxide ($Al_xO_y$), and the second material layer includes titanium oxynitride ($Ti_xO_yN_z$).

17. The semiconductor device of claim 16, further comprising:
a third material layer between the upper electrode and the second material layer, the third material layer including a combination of titanium nitride ($Ti_xN_y$) and titanium oxynitride ($Ti_xO_yN_z$).

18. The semiconductor device of claim 15, wherein:
the lower electrode has a hollow cylindrical shape with a closed bottom;
the dielectric layer is conformally formed on inner and outer surfaces of the lower electrode;
the first material layer is conformally formed on the dielectric layer; and
the second material layer is conformally formed on the first material layer,
wherein the first and second material layers partially fill an inside of the lower electrode.

19. The semiconductor device of claim 15, wherein:
the first material layer consists of a material that has a larger band gap than the dielectric layer.

20. The semiconductor device of claim 15, wherein:
the first material layer has a thickness in the range of 5 Å to 10 Å; and
the second material layer has a thickness in the range of 5 Å to 10 Å.

* * * * *